(12) United States Patent
Shimamura

(10) Patent No.: US 8,855,805 B2
(45) Date of Patent: Oct. 7, 2014

(54) CONVEYANCE VEHICLE SYSTEM

(75) Inventor: Kazunori Shimamura, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 403 days.

(21) Appl. No.: 13/375,488

(22) PCT Filed: May 28, 2010

(86) PCT No.: PCT/JP2010/003586
§ 371 (c)(1),
(2), (4) Date: Dec. 1, 2011

(87) PCT Pub. No.: WO2010/140325
PCT Pub. Date: Dec. 9, 2010

(65) Prior Publication Data
US 2012/0078411 A1    Mar. 29, 2012

(30) Foreign Application Priority Data

Jun. 2, 2009 (JP) ................................. 2009-132747

(51) Int. Cl.
*G06F 17/00* (2006.01)
*H01L 21/677* (2006.01)
*H01L 21/67* (2006.01)

(52) U.S. Cl.
CPC .... *H01L 21/67276* (2013.01); *H01L 21/67724* (2013.01); *H01L 21/67727* (2013.01); *H01L 21/67769* (2013.01)
USPC ........... 700/215; 700/112; 700/213; 414/626; 414/807; 340/572.1

(58) Field of Classification Search
USPC ......................................................... 700/215
See application file for complete search history.

(56) References Cited

U.S. PATENT DOCUMENTS

| 5,379,229 A * | 1/1995 | Parsons et al. ................. 700/215 |
| 2005/0211650 A1* | 9/2005 | Chung ........................... 211/134 |

(Continued)

FOREIGN PATENT DOCUMENTS

| JP | 08-225117 A | 9/1996 |
| JP | 2001-019123 A | 1/2001 |

(Continued)

OTHER PUBLICATIONS

English translation of Official Communication issued in corresponding International Application PCT/JP2010/003586, mailed on Dec. 22, 2011.
Official Communication issued in International Patent Application No. PCT/JP2010/003586, mailed on Sep. 7, 2010.

*Primary Examiner* — Gene Crawford
*Assistant Examiner* — Kyle Logan
(74) *Attorney, Agent, or Firm* — Keating & Bennett, LLP

(57) ABSTRACT

A conveyance vehicle system that achieves an increased efficiency of loading an article from a conveyance vehicle into a loading opening of an automated warehouse, includes a stocker, a conveyance vehicle, and a conveyance vehicle controller. The stocker includes racks, a loading port, and a stocker controller. The conveyance vehicle loads an article into the loading port of the stocker. The conveyance vehicle controller assigns the conveyance vehicle with an article conveyance command to convey the article to the stocker. The stocker controller receives a predicted conveyance command before the article is loaded from the conveyance vehicle into the stocker. The predicted conveyance command includes ID information of the article and information indicating whether or not the article is to be loaded into a rack.

14 Claims, 8 Drawing Sheets

(56) References Cited

U.S. PATENT DOCUMENTS

2006/0051192 A1* 3/2006 Fujiki .......................... 414/626
2007/0185604 A1* 8/2007 Kobayashi .................. 700/112
2007/0296585 A1* 12/2007 Ishida et al. ............... 340/572.1

FOREIGN PATENT DOCUMENTS

| JP | 2004-281622 A | 10/2004 |
| JP | 2005-162451 A | 6/2005 |
| JP | 2005-206272 A | 8/2005 |

* cited by examiner

FIG.8

| ID information | stocker | rack conveyance | conveyance rack | expected loading time |
|---|---|---|---|---|
| ABC001 | 001 | yes | 1-4-17 | 12:15:37 |
| ABC023 | 001 | yes | 1-8-31 | 12:17:12 |
| ABC131 | 002 | no | --- | 12:21:20 |

CONVEYANCE VEHICLE SYSTEM

BACKGROUND OF THE INVENTION

1. Field of the Invention

The present invention relates to a conveyance vehicle system including an automated warehouse including an automated warehouse controller, and a conveyance vehicle to transfer an article between the automated warehouse and the conveyance vehicle.

2. Description of the Related Art

Conventionally, there is known a conveyance vehicle system including a round track, a plurality of stations disposed along a route of the round track, and a plurality of conveyance vehicles traveling in one direction along the round track so as to convey articles. Between the stations and the conveyance vehicles, loading (an article to the conveyance vehicle from the station) and retrieving (the article from the conveyance vehicle to the station) are performed.

On the other hand, as an example of the above-mentioned station, there is known a stocker for stocking front opening unified pods (FOUPs) in a semiconductor factory. The stocker is an automated warehouse including a plurality of racks and a stacker crane moving along the racks. In the stocker, for example, when loading is performed, a ceiling conveyance vehicle conveys the FOUP to a loading port, and then the stacker crane conveys the FOUP to a predetermined rack. When retrieving is performed, the stacker crane conveys the FOUP from a predetermined rack to a shipping port, and then the ceiling conveyance vehicle conveys the FOUP away from the shipping port.

There is also known an automated warehouse in which a prior conveyance command is generated in advance only for an urgent article, and the article placed on the loading port is conveyed directly to the shipping port (see, for example, JP-A-2005-162451).

In the rear side of the loading port of the stocker, there is disposed a crane port, and a loading conveyer is disposed between the loading port and the crane port. The ceiling conveyance vehicle places the FOUP onto the loading port, and then the loading conveyer conveys the FOUP to the crane port. Then, the crane conveys the FOUP to a predetermined rack. On the shipping port side, there is disposed a same structure as the loading port so that the opposite action is performed.

A control action when the article is conveyed to the stocker will now be described. When the FOUP is placed on the loading port, an ID reader reads ID information of the FOUP and transmits the information to a stocker controller. Then, based on the ID information, the stocker controller transmits the ID information to a physical distribution controller and inquires whether or not the FOUP is to be conveyed. Then, the physical distribution controller transmits a conveyance command to the stocker controller. The stocker controller receives the conveyance command and, thereafter, controls the loading conveyer to transfer the article from the loading port to the crane port, and further controls the stacker crane to transfer the article from the crane port to a rack.

On the other hand, when the loading of the article from the conveyance vehicle starts, continuous loading may be performed at the loading port. Therefore, the article loaded to the loading port is required to be promptly conveyed to a rack of the automated warehouse. However, in the present circumstances, it is difficult to improve throughput at the loading port, and an article placed at the loading port may remain there. In this case, the conveyance vehicle cannot load another article to the loading port. As a result, conveyance efficiency of the entire conveyance vehicle system is significantly decreased.

SUMMARY OF THE INVENTION

Preferred embodiments of the present invention improve efficiency of loading an article from a conveyance vehicle to a loading opening of an automated warehouse in a conveyance vehicle system.

A conveyance vehicle system according to a preferred embodiment of the present invention includes an automated warehouse, a conveyance vehicle, and a conveyance vehicle controller. The automated warehouse includes racks, a loading opening, and an automated warehouse controller. The conveyance vehicle is configured to convey an article to the loading opening. The conveyance vehicle controller is configured to assign the conveyance vehicle with an article conveyance command to convey the article to the automated warehouse. The automated warehouse controller receives a predicted conveyance command before the article is loaded from the conveyance vehicle into the automated warehouse. The predicted conveyance command includes ID information of the article and information about whether or not the article is to be loaded into the racks.

In this system, the automated warehouse controller receives the predicted conveyance command before the article is loaded from the conveyance vehicle into the automated warehouse. Therefore, the automated warehouse controller can perform a conveyance preparation work before receiving the article. Therefore, the article can be promptly loaded into the rack after the article is received.

As a result, a state where the loading opening of the automated warehouse is vacant is increased, and therefore conveyance efficiency is hardly decreased even if the conveyance vehicle loads articles continuously into the loading opening.

In particular, because the predicted conveyance command includes information about whether or not to load the article into the racks, the automated warehouse controller can decide promptly whether or not the article placed on the loading opening is to be stored into the racks. Therefore, the conveyance preparation work before receiving the article can be performed more correctly.

The automated warehouse controller may generate position information of a position in the racks, into which the article is to be loaded, based on the predicted conveyance command. In this case, the conveyance preparation work before receiving the article can be performed more correctly.

The automated warehouse controller receives the predicted conveyance command after the conveyance vehicle is loaded with the article to be conveyed to the automated warehouse.

In this system, the automated warehouse controller receives the predicted conveyance command at time point when it is confirmed that the conveyance vehicle conveys the article to the automated warehouse. Therefore, the probability that the automated warehouse controller receives a wasteful predicted conveyance command is decreased. In other words, the automated warehouse controller can receive an accurate and correct command at the earliest possible timing. As a result, the automated warehouse controller can start the conveyance preparation work at the earliest timing.

The conveyance vehicle system may further include a system controller. The system controller is configured to manage the automated warehouse controller and the conveyance vehicle controller. In this case, the system controller transmits a conveyance command to the conveyance vehicle controller and then receives loading completion information of the conveyance vehicle from the conveyance vehicle controller. After that, the system controller transmits the predicted conveyance command to the automated warehouse controller.

In this system, because the system controller transmits the predicted conveyance command to the automated warehouse controller, efficient transmission can be performed. It is because the system controller has received the loading completion information of the conveyance vehicle from the conveyance vehicle controller, and special work is not necessary to grasp the situation. In addition, it is also not necessary to have a special communication environment.

The automated warehouse may further include a stacker crane and an ID reader. The ID reader is configured to read the ID information of the article conveyed to the loading opening. In this case, the automated warehouse controller stores the predicted conveyance command in a list. When receiving the ID information from the ID reader, the automated warehouse controller checks whether or not the ID information of the article matches with the predicted conveyance command in the list. If the ID information of the article matches with the predicted conveyance command in the list, the automated warehouse controller controls the stacker crane to transfer the article in the automated warehouse based on the predicted conveyance command.

In this system, the predicted conveyance command saved in the list can be securely processed.

The automated warehouse controller may store the predicted conveyance command together with the position information, and may further transfer the article to a position in the racks indicated by the position information.

A conveyance vehicle system control method according to another preferred embodiment of the present invention is a method for a conveyance vehicle system including an automated warehouse including racks and a loading opening, and a conveyance vehicle to convey an article to the loading opening. The method preferably includes a conveyance command assigning step of assigning the conveyance vehicle with an article conveyance command to convey the article to the automated warehouse; and a predicted conveyance command transmission step of transmitting, to the automated warehouse, a predicted conveyance command including ID information of the article and information about whether or not the article is to be loaded into the racks, before the article is loaded from the conveyance vehicle into the automated warehouse.

In this case, the predicted conveyance command is transmitted before the article is loaded from the conveyance vehicle into the automated warehouse. Therefore, the conveyance preparation work before receiving the article can be performed. Therefore, after the article is received, the article can be conveyed promptly to the racks.

As a result, a state in which the loading opening of the automated warehouse is vacant is increased, and therefore conveyance efficiency is hardly decreased even if the conveyance vehicle loads articles continuously into the loading opening.

In particular, because the predicted conveyance command includes information about whether or not to load the article into the racks, it is possible to decide promptly whether or not the article placed on the loading opening is to be stored into the racks. Therefore, the conveyance preparation work before receiving the article can be performed more correctly.

The method may further include a rack position information generation step of generating position information of a position in the racks, into which the article is to be loaded, based on the predicted conveyance command. In this case, the conveyance preparation work before receiving the article can be performed more correctly.

The predicted conveyance command transmission step may be performed after the conveyance vehicle is loaded with the article to be conveyed to the automated warehouse.

In this case, the predicted conveyance command is transmitted at time when it is confirmed that the conveyance vehicle conveys the article to the automated warehouse. Therefore, the probability of transmitting a wasteful predicted conveyance command is decreased. In other words, an assured command is transmitted at earliest. As a result, the conveyance preparation work can be started at early timing.

The method may further include a step of storing the predicted conveyance command; a step of reading ID information of the article conveyed to the loading opening; a step of checking whether or not the ID information of the article matches with the stored predicted conveyance command; and a step of transferring the article in the automated warehouse based on the predicted conveyance command if the ID information of the article matches with the stored predicted conveyance command.

In this system, the predicted conveyance command saved in the list can be securely performed.

The predicted conveyance command may be saved together with position information, and further the article may be transferred to a position in the racks indicated by the position information.

According to the conveyance vehicle system of various preferred embodiments of the present invention, efficiency of loading the article from the conveyance vehicle into the loading opening of the automated warehouse is greatly improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8 is a list of predicted conveyance commands stored in a memory of the stocker controller.

DETAILED DESCRIPTION OF THE PREFERRED EMBODIMENTS

As a preferred embodiment of the present invention, a conveyance vehicle system is a system for a plurality of conveyance vehicles to run on a predetermined conveyance track. The conveyance vehicle runs on the conveyance track in one direction. The conveyance vehicle loads an article at a target place, moves to a destination place, and unloads the article at the destination place, in accordance with a conveyance command assigned by a upper-level controller.

More specifically, the conveyance vehicle system is preferably arranged at a ceiling space of a clean room, for example, so as to convey articles such as FOUPs, which house semiconductor wafers, between load ports, such as a processing unit and an inspection unit. The conveyance track preferably includes two types of routes, namely a U-shaped intra-bay route along which processing units are arranged and an inter-bay route that connects intra-bay routes to each other, for example.

Figure 1:
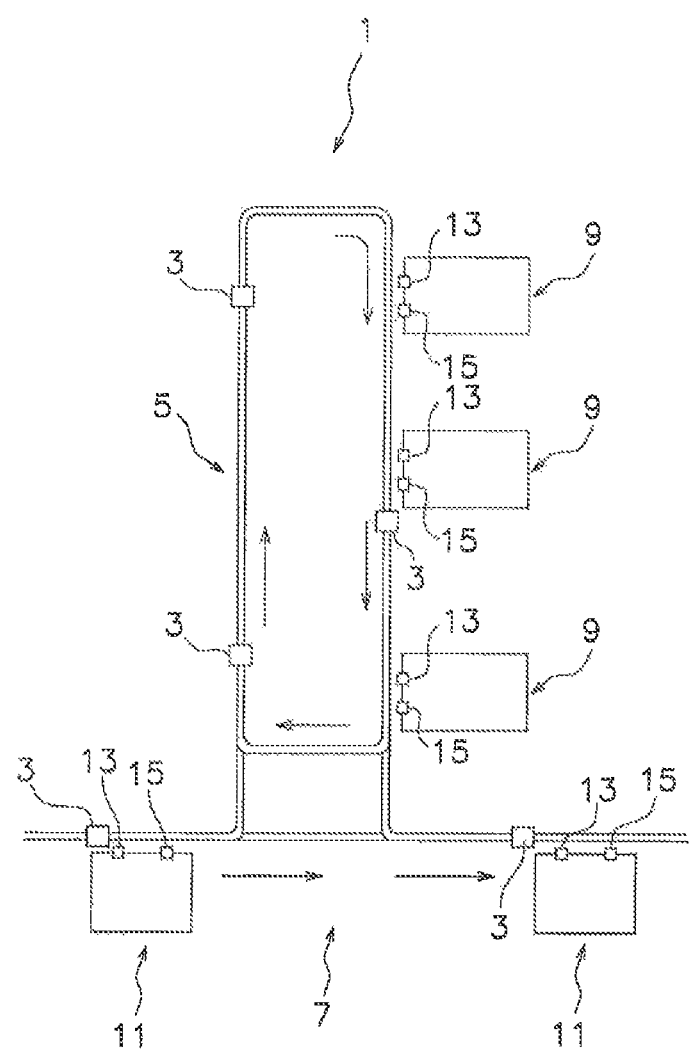
FIG. 1 is a partial plan view illustrating a layout of a conveyance vehicle system according to a preferred embodiment of the present invention.

With reference to FIG. 1, a layout of a conveyance vehicle system 1 is described. FIG. 1 is a partial plan view illustrating a layout of the conveyance vehicle system according to a preferred embodiment of the present invention.

The conveyance vehicle system 1 preferably includes a plurality of round travel paths 5 and a basic travel path 7 connecting the plurality of round travel paths 5. The basic travel path 7 defines a round path as a whole. A plurality of processing units 9 are disposed along each round travel path 5, and a plurality of stockers 11 are disposed along the basic travel path 7. Each stocker 11 functions as a buffer between groups of processing units 9 of the round travel path 5.

Facilities such as the processing unit 9 and the stocker 11 are each provided with a loading port 13 to load an article W into the facility and a shipping port 15 to load the article W from the facility into a conveyance vehicle 3. Note that a single port may serve both as the loading port 13 and the shipping port 15.

Although not illustrated in the diagram, the stocker 11 may be provided with a plurality of loading ports.

Figure 2:
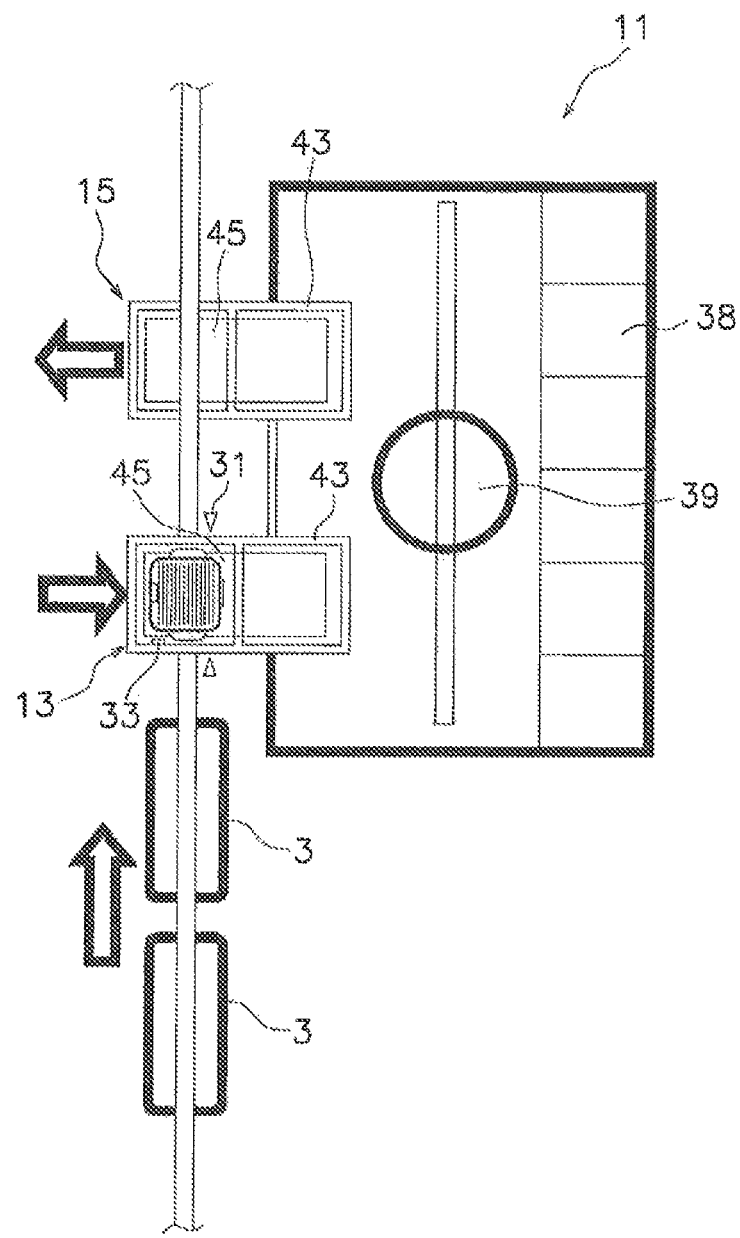
FIG. 2 is a schematic diagram illustrating a relationship between a stocker and the conveyance vehicle system.

With reference to FIG. 2, the stocker 11 is further described. The stocker 11 includes a plurality of racks 38 and a stacker crane 39. The stacker crane 39 can move along the racks 38 so as to convey the article W. In close vicinity of the loading port 13 of the stocker 11, there are disposed a crane port 43 and a loading conveyer 45. The loading port 13 is disposed outside the stocker 11, and the crane port 43 is disposed inside the stocker 11. The article W placed on the loading port 13 is conveyed to the crane port 43 by the loading conveyer 45, and is further conveyed to the racks 38 by the stacker crane 39.

The loading port 13 is provided with a load presence sensor 31. The load presence sensor 31 is a sensor arranged to detect that the article W is placed on the loading port 13. The load presence sensor 31 is a through-beam type photoelectric sensor, but may be other types of sensors. Further, in close vicinity of the loading port 13, there is disposed an ID reader 33 to read an ID attached to the article W. The ID may be a barcode or an RFID tag, for example. The ID reader 33 may be a barcode reader or an RFID reader, for example.

Figure 3:
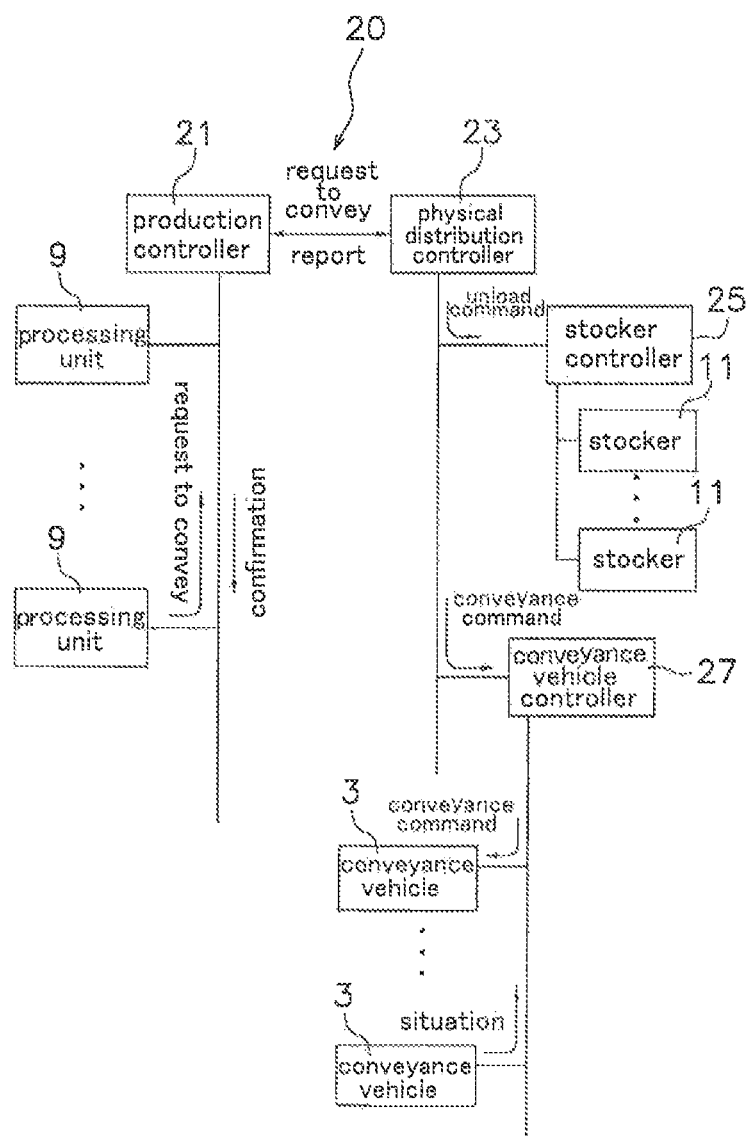
FIG. 3 is a block diagram illustrating a control system of the conveyance vehicle system.
Figure 4:
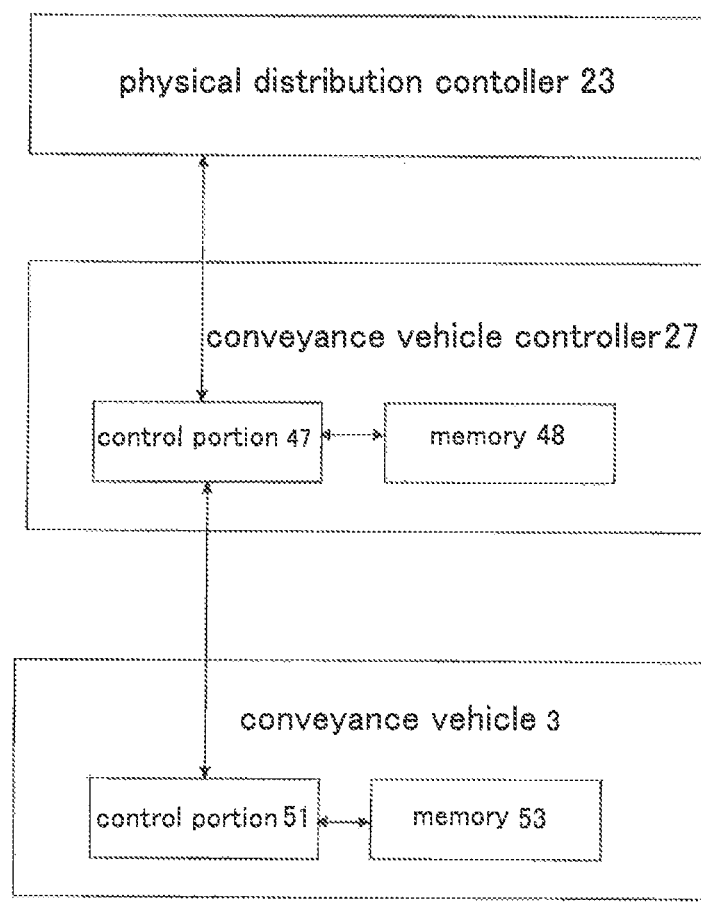
FIG. 4 is a block diagram illustrating a structure of a conveyance vehicle controller.
Figure 5:
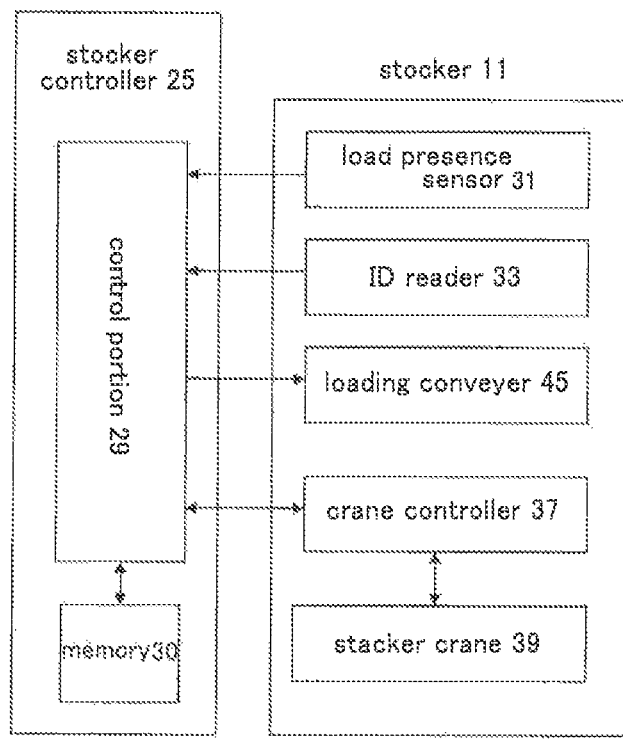
FIG. 5 is a schematic diagram illustrating a relationship between a stocker controller and the stocker.

With reference to FIGS. 3 to 5, a control system 20 of the conveyance vehicle system 1 is described. FIG. 3 is a block diagram illustrating the control system of the conveyance vehicle system. FIG. 4 is a block diagram illustrating a conveyance vehicle controller and the control system of the conveyance vehicle. FIG. 5 is a schematic diagram illustrating a relationship between the stocker controller and the stocker.

The control system 20 includes a production controller 21, a physical distribution controller 23 (system controller), a stocker controller 25 (automated warehouse controller), and a conveyance vehicle controller 27.

The physical distribution controller 23 is a upper-level controller of the stocker controller 25 and the conveyance vehicle controller 27.

The conveyance vehicle controller 27 manages a plurality of conveyance vehicles 3 and has an assigning function to assign conveyance commands to the conveyance vehicles 3. Note that the "conveyance command" includes a command concerning moving and a command concerning a loading position and an retrieving position.

The production controller 21 can communicate with the processing unit 9. The processing unit 9 transmits to the production controller 21 a request to convey (request to load and request to unload) the processed article W.

The production controller 21 transmits the request from the processing unit 9 to the physical distribution controller 23, and the physical distribution controller 23 transmits a report to the production controller 21.

The physical distribution controller 23 receives the request from the production controller 21 and transmits a load command or an unload command to the stocker controller 25 at a predetermined timing if the request is associated with loading or retrieving in the stocker 11. Then, the stocker controller 25 responds to the command and transmits the load command or the unload command to the stocker 11. Further, when receiving the request from the production controller 21, the physical distribution controller 23 converts the request into the conveyance command and assigns the conveyance vehicle 3 with the conveyance command.

The conveyance vehicle controller 27 communicates continuously with each conveyance vehicle 3 so as to generate the conveyance command, and obtains position information of each conveyance vehicle 3 based on position data transmitted from the conveyance vehicle 3. The following method is an example of obtaining the position information. A plurality of points are set along the conveyance track. When the conveyance vehicle 3 passes through a point, a passage signal is transmitted to the conveyance vehicle controller 27. After that, the conveyance vehicle controller 27 stores the latest passing point and passing time of the conveyance vehicle 3. Then, based on a standard speed and time in the point section, a position of the conveyance vehicle 3 is calculated and determined. Alternatively, the conveyance vehicle 3 is provided with an encoder, for example, and the conveyance vehicle 3 transmits to the conveyance vehicle controller 27 a travel distance after passing the point, as position data, so that the conveyance vehicle controller 27 may grasp the position of the conveyance vehicle 3.

With reference to FIG. 4, the conveyance vehicle controller 27 is described. FIG. 4 is a block diagram illustrating a structure of the conveyance vehicle controller 27.

The conveyance vehicle controller 27 preferably includes a CPU, a RAM, a ROM and other suitable elements, for example. The conveyance vehicle controller 27, which preferably is a computer that executes a program, includes a control portion 47 and a memory 48. The control portion 47 communicates with the conveyance vehicle 3 and with the physical distribution controller 23.

The memory 48 stores a route map. The route map is a map on which a layout of a travel route, a position of the origin, and coordinates of a reference position and a transfer position with respect to the origin are described. The coordinates are obtained by converting the travel distance from the origin into an output pulse number of the encoder or the like of the conveyance vehicle 3. The control portion 47 can read the route map from the memory 48.

The conveyance vehicle 3 includes a control portion 51 and a memory 53 as illustrated in FIG. 4. The control portion 51 preferably includes a CPU, a RAM, a ROM and other suitable elements, for example, and is a computer that executes a program. The control portion 51 can communicate with the conveyance vehicle controller 27. The conveyance vehicle 3 has the route map in the memory 53 and moves while comparing coordinates described in the route map with internal coordinates of itself (coordinates determined by the encoder).

With reference to FIG. 5, the stocker controller 25 and the stocker 11 are described. FIG. 5 is a schematic diagram illustrating a relationship between the stocker controller and the stocker.

The stocker controller 25 preferably includes a CPU, a RAM, a ROM and other suitable elements, for example. The stocker controller 25, which preferably is a computer that executes a program, includes a control portion 29 and a memory 30.

The stocker controller 25 is connected to the load presence sensor 31 and the ID reader 33, and can receive detection signals from them. The stocker controller 25 is connected to the loading conveyer 45 and can transmit a control signal to the loading conveyer 45.

The stocker controller 25 is connected to a crane controller 37 in a way such that communication between the two is possible. The crane controller 37 is connected to the stacker crane 39 and can transmit a control signal to the stacker crane 39.

Although only one stocker 11 is illustrated in FIG. 5, the stocker controller 25 can control a plurality of stockers 11 in this preferred embodiment.

Figure 6:
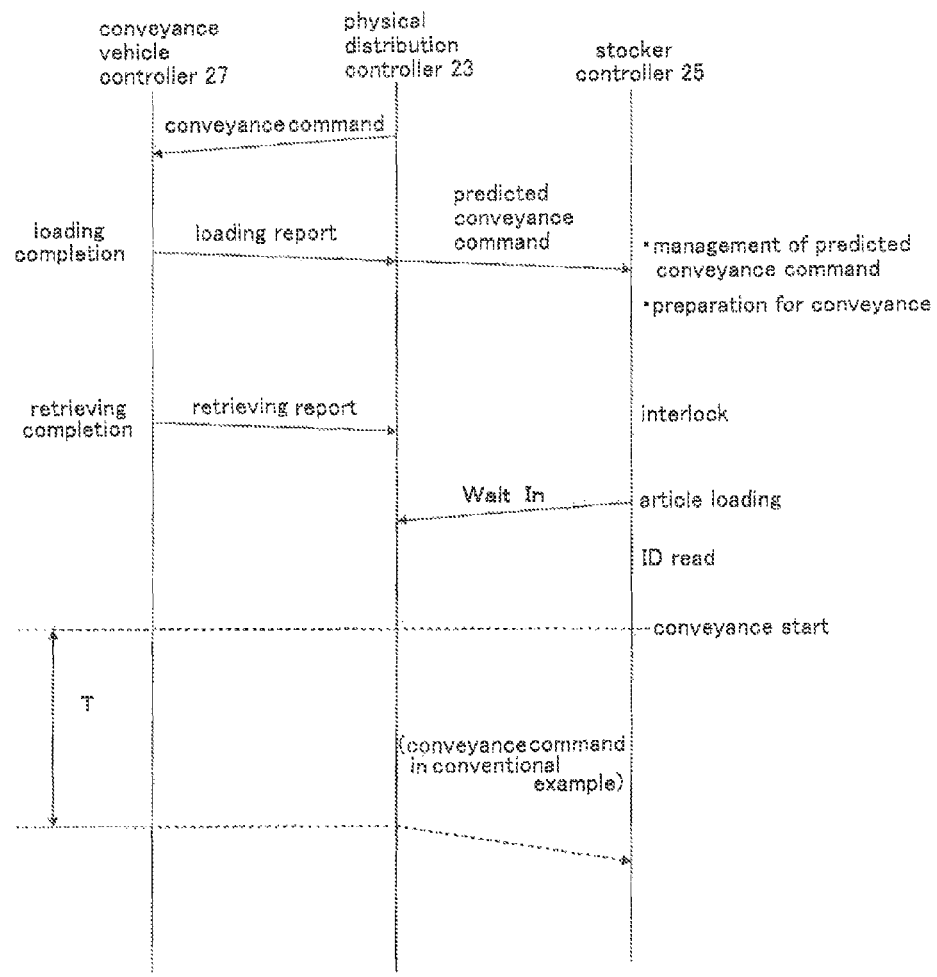
FIG. 6 is a diagram illustrating an article conveyance process by communication among the conveyance vehicle controller, a physical distribution controller, and the stocker controller.
Figure 7:
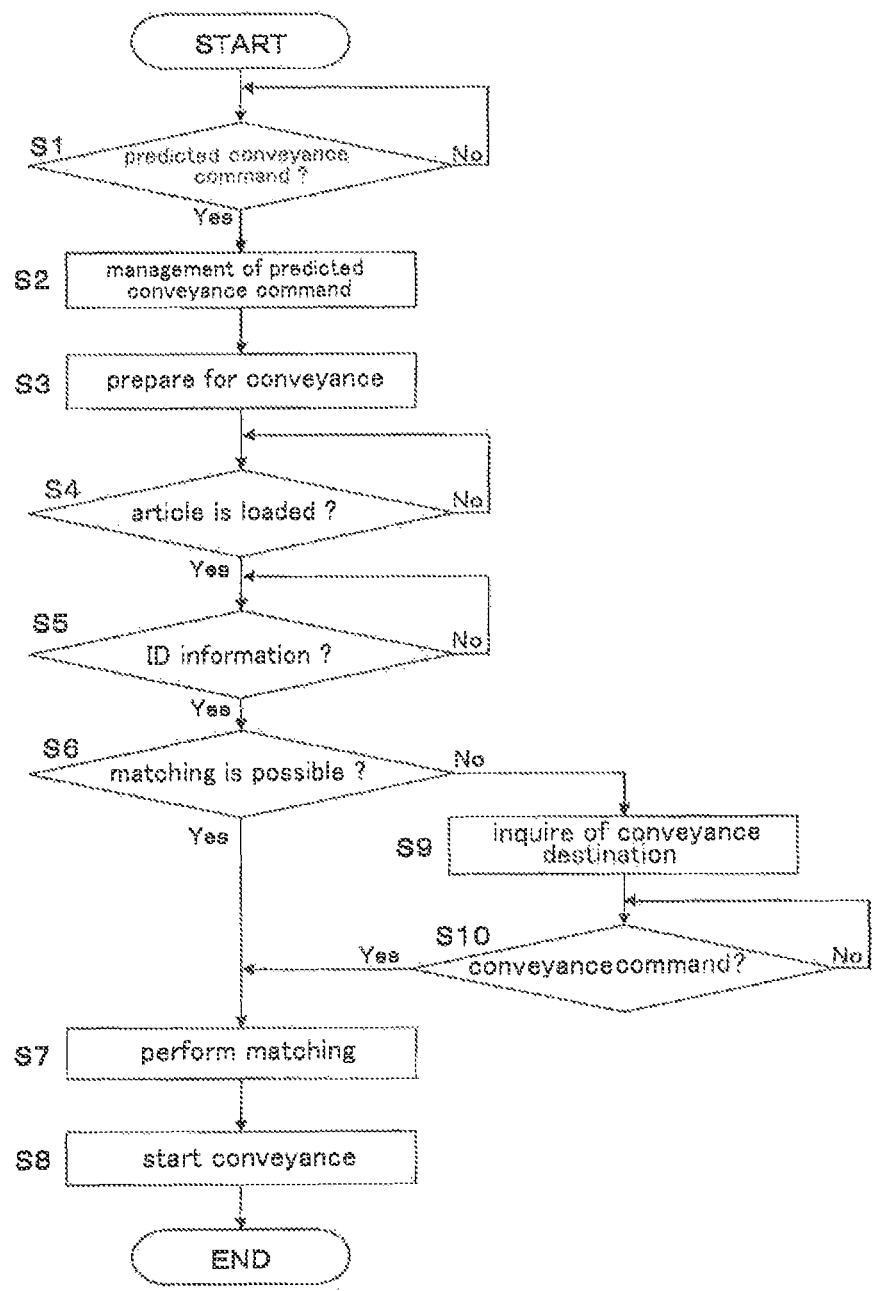
FIG. 7 is a flowchart illustrating a control action of the stocker controller.

With reference to FIGS. 6 and 7, the control action of the conveyance vehicle system 1 is described. FIG. 6 is a diagram illustrating an article conveyance process based on communication among the conveyance vehicle controller, the physical distribution controller and the stocker controller. FIG. 7 is a flowchart illustrating a control action of the stocker controller.

The following description describes the case where the conveyance vehicle 3 carrying the article W unloads the article at the loading port 13 of the stocker 11.

First, the physical distribution controller 23 transmits a conveyance command to the conveyance vehicle controller 27. Then, the conveyance vehicle controller 27 assigns conveyance vehicle 3 with the conveyance command.

The conveyance vehicle 3 travels to the processing unit 9, which serves as a conveyance source, and loads the article W from the shipping port 15 of the processing unit 9. The conveyance vehicle 3 transmits a loading completion report to the conveyance vehicle controller 27. The conveyance vehicle controller 27 transmits a loading report to the physical distribution controller 23. The physical distribution controller 23 transmits a predicted conveyance command to the stocker controller 25 (Yes in Step S1 of FIG. 7). The predicted conveyance command contain various information, such as expected arrival time of the conveyance vehicle 3 or a period of time after the loading until arrival, the ID information of the article, conveyance destination information (stocker number), and information about whether or not the article W is to be loaded into the racks 38. Note that these pieces of information are not particularly limited, and can be combined appropriately as necessary.

The control portion 29 of the stocker controller 25 stores the predicted conveyance command in the memory 30 (Step S2 in FIG. 7). In addition, the stocker controller 25 receives the predicted conveyance command and generates position information (rack number) of the racks 38 to which the article W is to be conveyed, in advance. As a result, the predicted conveyance command is stored in a list format as illustrated in FIG. 8.

Further, the control portion 29 of the stocker controller 25 performs conveyance preparation prior to the loading commanded by the predicted conveyance command (Step S3 in FIG. 7). Specifically, if there is an article W in the loading port 13 of the stocker port 11, the control portion 29 drives the loading conveyer 45 to transfer the article W to the crane port 43. Further, the control portion 29 of the stocker controller 25 drives the stacker crane 39 to transfer the article W to the racks 38. Other than that, the control portion 29 may drive the stacker crane 39 to transfer articles W in the racks 38.

In particular, the control portion 29 of the stocker controller 25 sums up the number of predicted conveyance commands to the loading port 13, from each stocker 11. If the summed number exceeds a threshold value so that congestion is expected, the loading process of the article W on the loading port 13 is performed prior to other loading ports or other actions.

When the conveyance vehicle 3 arrives at the loading port 13, the conveyance vehicle 3 unloads the article W at the loading port 13 (Step S4 of FIG. 7). The conveyance vehicle 3 transmits an unload report to the conveyance vehicle controller 27. Next, the conveyance vehicle controller 27 transmits the unload report to the physical distribution controller 23.

In addition, the control portion 29 of the stocker controller 25 receives a detection signal from the load presence sensor 31 (Yes in Step S4 of FIG. 7). A wait in signal is not necessary because the stocker controller 25 is capable of controlling conveyance based on the predicted conveyance command even if no command is received from an upper-level unit.

Next, the ID reader 33 reads ID information of the article W (Step S5 in FIG. 7) and transmits the ID information to the stocker controller 25. When receiving the ID information, the stocker controller 25 determines whether or not matching is possible between the ID information and the predicted conveyance command (Step S6 in FIG. 7). If matching is possible, the stocker controller 25 performs the matching between the ID information and the predicted conveyance command (Step S7 in FIG. 7). If matching is impossible, the stocker controller 25 inquires of the physical distribution controller 23 about conveyance destination (e.g., rack number) based on the ID information (Step S9). The physical distribution controller 23 sends the conveyance command to the stocker controller 25 (Yes in Step S10 of FIG. 7).

Further, the control portion 29 of the stocker controller 25 drives the loading conveyer 45 to transfer the article W from the loading port 13 to the crane port 43 (Step S8 in FIG. 7).

Note that the stocker controller 25 performs ID communication with the physical distribution controller 23 after the conveyance starts. This ID communication is used to confirm that the predicted conveyance command is correct and to update management data in the upper-level unit. Note that in the conventional system, this ID communication enables the physical distribution controller to determine the conveyance command and further to issue a command to the stocker controller.

When the article W arrives at the crane port 43, the crane controller 37 transmits a control signal to the stacker crane 39 and controls the stacker crane 39 to transfer the article W to the racks 38. Alternatively, the stacker crane 39 transfers the article W to the crane port of the shipping port 15 instead of storing the article W into the racks 38.

In the control action described above, the predicted conveyance command is transmitted in advance to the control portion 29 of the stocker controller 25. Therefore, when the article W is actually conveyed to the loading port 13, the stocker 11 very likely can promptly start storing the article W into the racks 38.

In the conventional system, as illustrated in FIG. 6, the stocker 11 cannot start storing the article W into the racks 38 until the conveyance command is transmitted to the stocker controller 25 from the physical distribution controller 23. The storing action start time in this preferred embodiment preferably is earlier than the conventional storing action start time by a shortening period of time T (e.g., about two seconds).

The above-mentioned preferred embodiment of the present invention can be further described as follows.

The conveyance vehicle system 1 preferably includes the stocker 11, the conveyance vehicle 3, and the conveyance vehicle controller 27. The stocker 11 includes the racks 38, the loading port 13, and the stocker controller 25. The conveyance vehicle 3 is to convey the article W to the loading port 13. The conveyance vehicle controller 27 assigns the conveyance vehicle 3 with the article conveyance command to convey the article W to the stocker 11. The stocker controller 25 receives the predicted conveyance command before the article W is transferred from the conveyance vehicle 3 to the stocker 11. The predicted conveyance command includes the ID information of the article W and the information about whether or not the article W is to be loaded into the racks 38.

In this system, the stocker controller 25 receives the predicted conveyance command before the article W is transferred from the conveyance vehicle 3 to the stocker 11. Therefore, the stocker controller 25 can perform a conveyance preparation work before receiving the article W. Therefore, it is possible to transfer the article W promptly to the racks 38 after receiving the article W.

As a result, the state in which the loading port 13 of the stocker 11 is vacant is increased. Therefore, conveyance efficiency is hardly decreased even when the conveyance vehicles 3 continuously load articles W into the loading port 13.

In particular, because the predicted conveyance command includes the information about whether or not the article W is to be loaded into the racks 38, the stocker controller 25 can determine promptly whether or not the article W placed on the loading port 13 is to be stored into the racks 38. Therefore, the conveyance preparation work is performed more accurately before the article W is received.

The stocker controller 25 generates the position information of the racks 38 to which the article W is to be conveyed based on the predicted conveyance command. Therefore, the conveyance preparation work is performed more accurately before the article W is received.

The stocker controller 25 receives the predicted conveyance command after the conveyance vehicle 3 is loaded with the article W to be conveyed to the stocker 11.

In this system, when it is finally confirmed that the conveyance vehicle 3 is to load the article W into the stocker 11, the stocker controller 25 receives the predicted conveyance command. Therefore, there is little probability that the stocker controller 25 receives a useless or incorrect predicted conveyance command. In other words, the stocker controller 25 can receive an assured and correct command at earliest timing. As a result, the stocker controller 25 can start the conveyance preparation work as early as possible.

The conveyance vehicle system 1 further includes the physical distribution controller 23 that controls the stocker controller 25 and the conveyance vehicle controller 27. The physical distribution controller 23 transmits the conveyance command to the conveyance vehicle controller 27 and further transmits the predicted conveyance command to the stocker controller 25 after receiving from the conveyance vehicle controller 27 information that the conveyance vehicle 3 has completed the loading.

In this system, because the physical distribution controller 23 transmits the predicted conveyance command to the stocker controller 25, the transmission can be performed efficiently. It is because the physical distribution controller 23 has received from the conveyance vehicle controller 27 the loading completion information of the conveyance vehicle 3, and a special procedure is not necessary for grasping the situation. In addition, a special communication environment is not necessary.

The stocker 11 further includes the stacker crane 39 and the ID reader 33 that reads ID information of the article W that has been conveyed to the loading port 13. The stocker controller 25 stores a list of the predicted conveyance commands. When receiving the ID information from the ID reader 33, the stocker controller 25 checks whether or not the ID information of the article W matches with the predicted conveyance command in the list. If the ID information of the article matches with the predicted conveyance command in the list, the stocker controller 25 controls the stacker crane 39 to transfer the article W in the stocker 11 based on the predicted conveyance command.

In this system, the predicted conveyance command stored in the list can be securely processed.

Although a preferred embodiment of the present invention has been described above, the present invention is not limited to the preferred embodiment described above, and can be modified variously without deviating from the spirit of the present invention. In particular, the plurality of preferred embodiments and variations described in this specification can be combined arbitrarily as necessary.

The combination of the information contained in the predicted conveyance command is not limited to the above-mentioned preferred embodiment. For instance, the rack number may not be included in the predicted conveyance command.

The physical distribution controller 23 preferably transmits the predicted conveyance command in the above-mentioned preferred embodiment, but what generates the predicted conveyance command is not limited to the physical distribution controller 23. For instance, the conveyance vehicle controller 27 may generate the predicted conveyance command and transmit it directly to the stocker controller 25.

When the stocker controller 25 reads the ID of the article W, the stocker controller 25 does not inquire of the physical distribution controller 23 in the above-mentioned preferred embodiment, but it is possible that the stocker controller 25 performs the inquiry. In this case, for example, the physical distribution controller 23 transmits the conveyance command (override) to the stocker controller 25. Thus, the stocker controller 25 can convey the article W to the racks 38 based on a more reliable conveyance command. For instance, even if a change occurs after the predicted conveyance command has been transmitted, the changed content can be used.

In the above-mentioned preferred embodiment, after the predicted conveyance command has been received, the stocker controller 25 preferably waits indefinitely for the detection of the article W (Step S4 of FIG. 7). However, if the article W does not actually arrive within a certain period of time after the expected time point, the stocker controller 25 may transmit a conveyance cancel request signal to the physical distribution controller 23 and then may delete the predicted conveyance command from the list so as to wait for a new predicted conveyance command.

The predicted conveyance command may include information of a specific loading port of the conveyance destination among a plurality of loading ports.

In the above-mentioned preferred embodiment, the stocker preferably including a plurality of loading ports is exemplified, but the present invention can be also applied to an automated warehouse having a single loading port.

In the above-mentioned preferred embodiment, a single stocker controller preferably controls a plurality of stockers, but it is possible to prepare controllers for individual stockers, respectively.

Preferred embodiments of the present invention can be widely applied to a conveyance vehicle system including an automated warehouse having an automated warehouse controller and a conveyance vehicle that loads and unloads articles with respect to the automated warehouse.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A conveyance vehicle system comprising:
an automated warehouse including racks, a loading port, a crane port, a loading conveyor configured to move an article placed on the loading port to the crane port, and a stacker crane configured to transfer the article between the crane port and the racks, and an automated warehouse controller configured and programmed to control the loading conveyor and the stacker crane;
a conveyance vehicle configured to convey an article to the loading port; and
a conveyance vehicle controller configured and programmed to assign the conveyance vehicle with an article conveyance command to convey the article to the automated warehouse; wherein
the automated warehouse controller is configured and programmed to receive a predicted conveyance command including ID information of the article and information about whether or not the article is to be loaded into the racks before the article is loaded from the conveyance vehicle into the automated warehouse, and to execute a conveyance preparation operation including at least one of controlling the loading conveyor to move the article placed on the loading port to the crane port and controlling the stacker crane to move the article between the crane port and the racks before the article is loaded to the loading port.

2. The conveyance vehicle system according to claim 1, wherein the automated warehouse controller is configured and programmed to receive the predicted conveyance command after the conveyance vehicle is loaded with the article to be conveyed to the automated warehouse.

3. The conveyance vehicle system according to claim 1, further comprising a system controller configured and programmed to manage the automated warehouse controller and the conveyance vehicle controller, wherein
the system controller is configured and programmed to transmit a conveyance command to the conveyance vehicle controller and then receive loading completion information of the conveyance vehicle from the conveyance vehicle controller, and thereafter transmits the predicted conveyance command to the automated warehouse controller.

4. The conveyance vehicle system according to claim 1, wherein
the automated warehouse further includes an ID reader configured to read the ID information of the article conveyed to the loading port, and
the automated warehouse controller is configured and programmed to store the predicted conveyance command in a list and, when receiving the ID information from the ID reader, check whether or not the ID information of the article matches with the predicted conveyance command in the list, and if the ID information of the article matches with the predicted conveyance command in the list, the automated warehouse controller is configured and programmed to control the loading conveyor to load the article to the crane port, and then control the stacker crane to transfer the article in the automated warehouse based on the predicted conveyance command.

5. The conveyance vehicle system according to claim 1, wherein the conveyance preparation operation includes generating position information of a position in the racks, into which the article is to be loaded, based on the predicted conveyance command.

6. The conveyance vehicle system according to claim 5, wherein the automated warehouse controller is configured and programmed to receive the predicted conveyance command after the conveyance vehicle is loaded with the article to be conveyed to the automated warehouse.

7. The conveyance vehicle system according to claim 5, further comprising a system controller configured and programmed to manage the automated warehouse controller and the conveyance vehicle controller, wherein
the system controller is configured and programmed to transmit a conveyance command to the conveyance vehicle controller and thereafter transmit the predicted conveyance command to the automated warehouse controller.

8. The conveyance vehicle system according to claim 5, wherein
the automated warehouse further includes an ID reader configured to read the ID information of the article conveyed to the loading port, and
the automated warehouse controller is configured and programmed to store the predicted conveyance command together with the position information in a list and, when receiving the ID information from the ID reader, check whether or not the ID information of the article matches with the predicted conveyance command in the list, and if the ID information of the article matches with the predicted conveyance command in the list, the automated warehouse controller is configured and programmed to control the loading conveyor to load the article to the crane port, and then control the stacker crane to transfer the article to a position in the racks indicated by the position information.

9. A conveyance vehicle system control method for a conveyance vehicle system comprising an automated warehouse including racks, a loading port, a crane port, a loading conveyor configured to move an article placed on the loading port to the crane port, and a stacker crane configured to transfer the article between the crane port and the racks; and a conveyance vehicle to convey an article to the loading opening, the method comprising:
a conveyance command assigning step of assigning the conveyance vehicle with an article conveyance command to convey the article to the automated warehouse;
a predicted conveyance command transmission step of transmitting, to the automated warehouse, a predicted conveyance command including ID information of the article and information about whether or not the article is to be loaded into the racks, before the article is loaded from the conveyance vehicle into the automated warehouse; and a controlling step of controlling the automated warehouse to execute a conveyance preparation operation including at least one of controlling the loading conveyor to move the article placed on the loading port to the crane port and controlling the stacker crane to move the article between the crane port and the racks before the article is loaded to the loading port, based on the predicted conveyance command.

10. The conveyance vehicle system control method according to claim 9, wherein the predicted conveyance command transmission step is performed after the conveyance vehicle is loaded with the article to be conveyed to the automated warehouse.

11. The conveyance vehicle system control method according to claim 9, further comprising:
- a step of storing the predicted conveyance command;
- a step of reading ID information of the article conveyed to the loading port;
- a step of checking whether or not the ID information of the article matches with the stored predicted conveyance command; and
- a step of controlling the loading conveyor to load the article to the crane port, and then controlling the stacker crane to move the article between the crane port and the racks based on the predicted conveyance command if the ID information of the article matches with the stored predicted conveyance command.

12. The conveyance vehicle system control method according to claim 9, wherein the conveyance preparation operation includes a rack position information generation step of generating position information of a position in the racks, into which the article is to be loaded, based on the predicted conveyance command.

13. The conveyance vehicle system control method according to claim 12, wherein the predicted conveyance command transmission step is performed after the conveyance vehicle is loaded with the article to be conveyed to the automated warehouse.

14. The conveyance vehicle system control method according to claim 12, further comprising:
- a step of storing the predicted conveyance command together with the position information;
- a step of reading ID information of the article conveyed to the loading port;
- a step of checking whether or not the ID information of the article matches with the stored predicted conveyance command; and
- a step of controlling the loading conveyor to load the article to the crane port, and then controlling the stacker crane to transfer the article to a position in a rack indicated by the position information if the ID information of the article matches with the stored predicted conveyance command.

* * * * *